United States Patent [19]

Kaiser

[11] 3,913,214

[45] Oct. 21, 1975

[54] METHOD OF PRODUCING A SEMICONDUCTOR DEVICE

[75] Inventor: Reinhold Kaiser, Heilbronn, Germany

[73] Assignee: Licentia Patent-Verwaltungs, Frankfurt, Germany

[22] Filed: Jan. 22, 1974

[21] Appl. No.: 435,514

Related U.S. Application Data

[62] Division of Ser. No. 74,274, Sept. 22, 1970, Pat. No. 3,817,750.

[30] Foreign Application Priority Data

May 5, 1970 Germany .......................... 2021922

[52] U.S. Cl. ........................ 29/578; 29/580; 29/589

[51] Int. Cl.² ........................................ B01J 17/00

[58] Field of Search ........................ 29/578, 580, 589

[56] References Cited

UNITED STATES PATENTS

| | | | |
|---|---|---|---|
| 3,266,127 | 8/1966 | Harding | 29/578 |
| 3,607,480 | 9/1971 | Harrap | 29/578 |

*Primary Examiner*—W. Tupman

*Attorney, Agent, or Firm*—Spencer & Kaye

[57] ABSTRACT

A method of producing a semiconductor device comprises providing a metal layer between an insulating layer and a photosensitive layer or a semiconductor body when providing contact making windows in the insulating layer by etching.

10 Claims, 34 Drawing Figures

METHOD OF PRODUCING A SEMICONDUCTOR DEVICE

CROSS REFERENCE TO RELATED APPLICATION

This application is a division of Application Ser. No. 74,274, filed Sept. 22nd, 1970 now U.S. Pat. No. 3,817,750.

BACKGROUND OF THE INVENTION

The invention relates to a method of producing a semiconductor device, wherein apertures such as contact-making windows for example, are produced in an insulating layer present on the semiconductor body, by means of a photosensitive layer as an etching mask.

SUMMARY OF THE INVENTION

According to the invention, there is provided a method of producing a semiconductor device comprising the steps of forming an insulating layer on a semiconductor body, applying a metal layer to said insulating layer, applying a photosensitive layer to said metal layer, exposing said photosensitive layer to an appropriate pattern and etching said photosensitive layer, said metal layer and said insulating layer to define at least one aperture therethrough.

BRIEF DESCRIPTION OF THE DRAWINGS

The invention will now be described in greater detail, by way of example, with reference to the accompanying drawings, in which.

DESCRIPTION OF THE PREFERRED EMBODIMENTS

Figure 1:
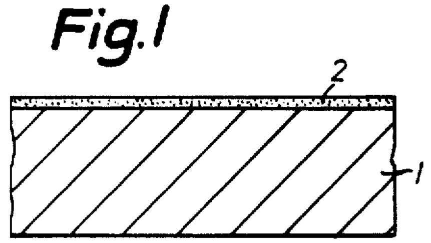
FIG. 1 is a diagrammatic sectional view of a semiconductor body at a first stage in the production of a semiconductor diode in accordance with a first embodiment of the method of the invention.

The invention is used, for example, in the production of bipolar transistors, diodes, depletion-layer field effect transistors, controlled rectifiers, resistors, capacitors as well as switching circuits with the said components. The invention has the advantage that the stability of the semiconductor devices is improved thereby.

If the invention, which is used for semiconductor devices the insulating layer of which can be structured by etching by means of a photosensitive layer as an etching mask, is used for making contact to semiconductor devices, then the photosensitive layer is removed after the production of the aperture(s), and a second metal layer, which also covers the region of the semiconductor surface exposed by the apertures(s), is applied, for example, to the already existing metal layer. Then the parts not needed for the electrode(s) of the two metal layers are removed. This is effected for example by means of the photolithographic etching technique, using a photosensitive layer which generally consists of a lacquer. Both the metal layer provided as an intermediate layer and also the (second) metal layer provided for the electrode material may be produced by vapour-deposition for example.

A semiconductor diode for example is produced according to the invention in that one surface of a semiconductor body is covered with an insulating layer, an aperture is introduced into this insulating layer as a diffusion window, and a diffusion region, which has the opposite type of conductivity to the semiconductor body, is diffused into the semiconductor body. Then a metal layer is applied to the insulating layer, which is closed again during or after the diffusion, a photosensitive layer is applied to this metal layer, a contact-making window for making contact to the semiconductor region diffused into the semiconductor body is introduced, by means of the photolithographic etching technique, into the metal layer and into the insulating layer beneath it, and the semiconductor surface exposed by the contact-making window is covered with electrode material, the metal layer being left on the insulating layer.

In order to produce a transistor according to the invention, one surface of a semiconductor body of the type of conductivity of the collector region, for example, is covered with an insulating layer and the base region is diffused into the semiconductor body through a base-diffusion window in this insulating layer, and the emitter region is diffused into the semiconductor body through an emitter-diffusion window in this insulating layer. After this diffusion, a metal layer is applied to the insulating layer, which is closed again during or after the emitter diffusion, and a photosensitive layer is applied to this metal layer. Then by means of the photolithographic etching technique, contact-making windows for making contact to the emitter region, the base region and possibly also the collector region, are introduced into the metal layer as well as the insulating layer beneath it. The semiconductor surface exposed by the contact-making window is then finally covered with electrode material, the metal layer being left on the insulating layer.

The metal layer provided as an intermediate layer between the insulating layer and the photosensitive layer consists, for example of aluminium, gold, chromium or platinum. According to a further development of the invention, yet another intermediate layer is provided as a getter or passivating layer, apart from the metal layer, between the insulating layer and the photosensitive layer, being disposed between the metal layer and the insulating layer. This getter or passivating layer may consist, for example, of doped silicon oxide, silicon nitride, aluminium oxide or of oxides or nitrides of other elements.

Referring now to FIGS. 1 to 10 of the accompanying drawings, there is shown an example of the production of a planar diode according to the invention. In order to produce such a diode, the starting point, shown in FIG. 1, is a semiconductor body 1 which consists of silicon for example. In order to produce a diffusion region restricted to a limited area of the semiconductor body, an insulating layer 2, which consists of silicon dioxide, for example, is provided, as a diffusion mask, on the one surface of the semiconductor body 1.

Figure 2:
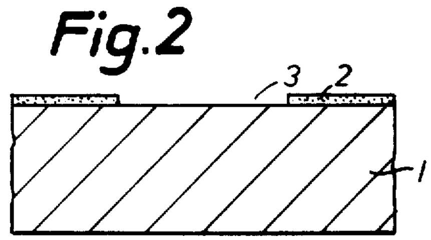
FIGS. 2 to 10 are views similar to FIG. 1 showing further stages in the production of a semiconductor diode in accordance with the first embodiment of the method.
Figure 3:
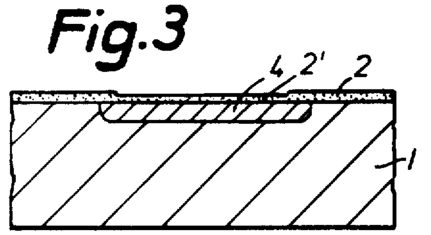

Then, as shown in FIG. 2, a diffusion window 3, through which the semiconductor region 4 is diffused into the semiconductor body 1 as shown in FIG. 3, is introduced into this insulating layer 2. In order to form the p-n junction necessary for the diode, the semiconductor region 4 has the opposite type of conductivity to the semiconductor body. Since the contact-making window should be made smaller than the diffusion window in order to make contact with the semiconductor region 4, the diffusion window 3 must be closed again, during or after the diffusion, namely by an insulating layer 2' which is generally produced, during the diffusion, by a diffusion treatment in an oxidising atmosphere.

Figure 4:
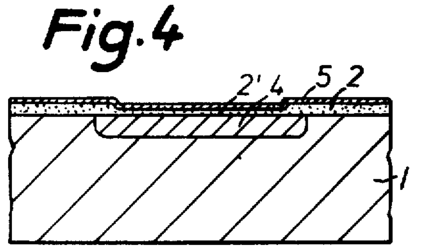
Figure 5:
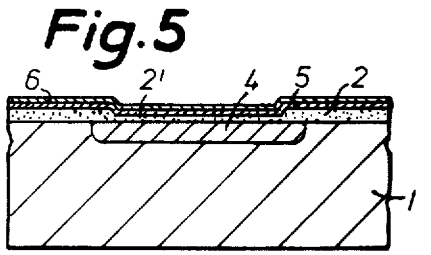

In order to produce a contact-making window in the insulating layer 2', a photosensitive layer is not applied directly to the insulating layer as in known methods, but first an intermediate layer 5 of metal, as shown in FIG. 4, to which the photosensitive layer 6 is then applied as shown in FIG. 5. The metal intermediate layer 5 may consist of aluminium for example.

Figure 6:
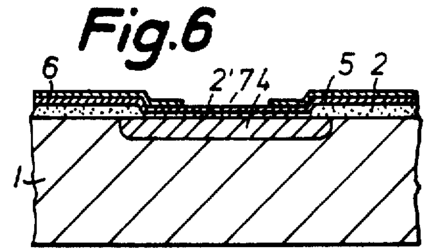
Figure 7:
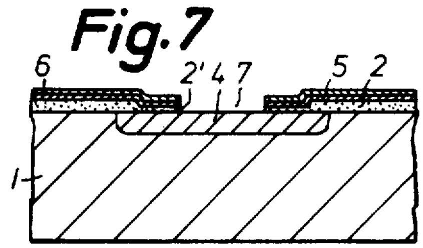
Figure 8:
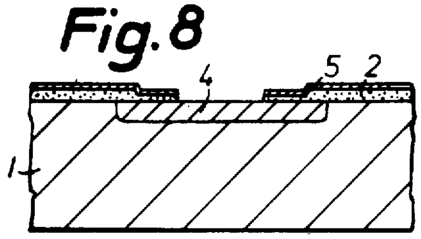

In order to produce the contact-making window, the photosensitive layer 6 is then exposed in a structured manner and treated with a solution which, as shown in FIG. 6, dissolves that part, out of the photosensitive layer, which covers the area of the contact-making window. As a result of the dissolving process, the aperture 7 is formed in the photosensitive layer 6 and is subsequently extended as far as the surface of the semiconductor as a contact-making window by means of an etching process, shown in FIG. 7. The photosensitive layer 6 serves as an etching mask during this etching process, during which the insulating layer 2' is etched through as well as the metal layer 5. FIG. 8 shows the production stage of the semiconductor diode without the photosensitive layer 6, that is to say after the removal of this layer.

Figure 9:
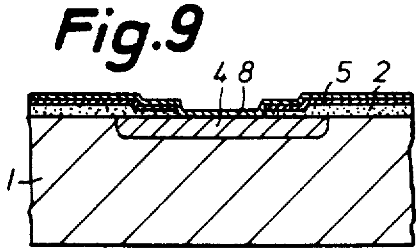
Figure 10:
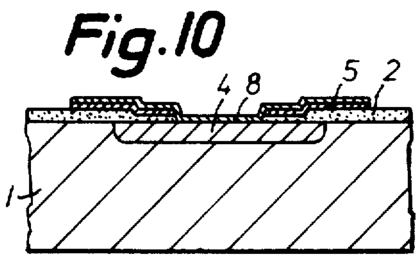

After exposure of the semiconductor surface and after the removal of the photosensitive layer, a second metal layer 8, which serves to make contact to the semiconductor region 4 diffused into the semiconductor body 1, is applied to the area of the semiconductor surface exposed by the contact-making window, shown in FIG. 9. Thus the first metal layer is left on the surface when the electrode material is applied (second metal layer). Like the first metal layer 5, the second metal layer 8 is preferably vapour-deposited. Aluminium, for example, is likewise suitable as material for the second metal layer 8. The two metal layers may naturally consist of different materials. The final structure of the electrode provided for making contact to the semiconductor region 4 is obtained by removal of the parts of the two metal layers, not needed for this electrode, for example by structured etching, wherein not only the parts of the second metal layer which are no longer needed but also the parts of the first metal layer 5 which are no longer needed are etched away. FIG. 10 shows the finished semiconductor diode with the finished contact electrode 9. In order to make contact to the semiconductor body to which contact has not yet been made in FIG. 10, an electrode may be provided on the semiconductor body at the side opposite the contact electrode 9.

It may be mentioned at this point that both in the previous example and also in the following examples, the photolithographic etching process is merely explained in connection with the production of the contact-making window, because during this production process, the use of the metal intermediate layer according to the invention is particularly important, whereas in the other photolithographic processes, as in the production of the diffusion window, for example, or in the production of the structure for the contact electrode, the photolithographic process is not discussed in detail.

FIGS. 11 to 18 correspond to FIGS. 4 to 10 of the first example and likewise relate to the production of a planar diode. In contrast to the first example, however, in the second example in FIGS. 11 to 18, not only the metal intermediate layer 5 but also a further intermediate layer 9 is provided between the insulating layer 2 and the photosensitive layer 6 and has the property of a getter layer or passivating layer, and generally is likewise an insulating layer. This intermediate layer 9, which consists, for example, of doped silicon oxide, silicon nitride, aluminium oxide or oxides or nitrides of other elements, is provided directly on the insulating layer 2, between the metal layer 5 and the insulating layer 2.

Figure 11:
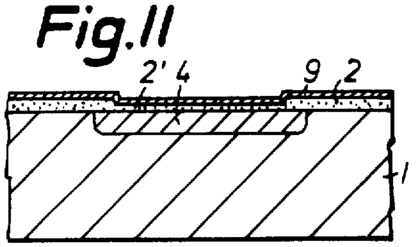
FIGS. 11 to 18 are views similar to FIG. 1 but showing stages in the production of a semiconductor diode in accordance with a second embodiment of the method.

In the production stage shown in FIG. 11, the semiconductor region 4, which has the opposite type of conductivity to the semiconductor body 1, has already been diffused into the semiconductor body 1, namely using the insulating layer 2 as a diffusion mask. In FIG. 11, the diffusion window has already been closed again, namely by means of the insulating layer 2'.

Figure 12:
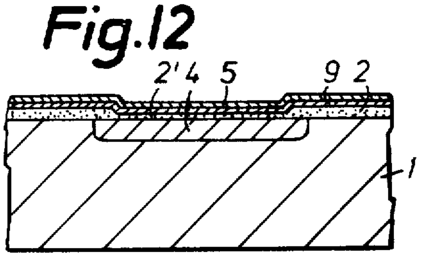
Figure 13:
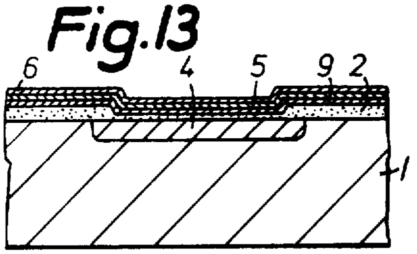

In contrast to the first example of FIGS. 1 to 10, in the second example of FIGS. 11 to 18, the metal layer 5 provided according to the invention is not applied directly to the insulating layer 2 or 2', but first a getter or passivating layer, which is designated by the reference number 9 in FIG. 11. This layer is then followed by the metal layer 5, as shown in FIG. 12, to which the photosensitive layer 6 provided as an etching mask is then finally applied as shown in FIG. 13.

Figure 14:
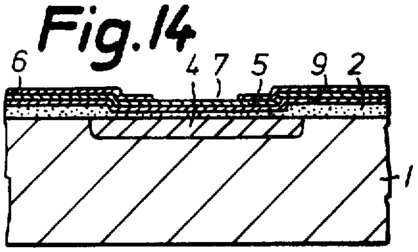
Figure 15:
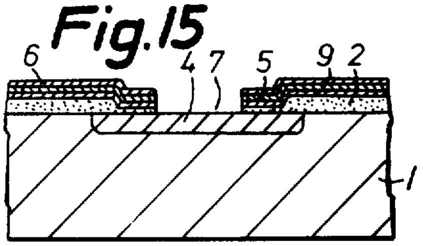
Figure 16:
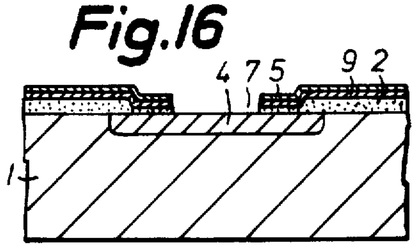
Figure 17:
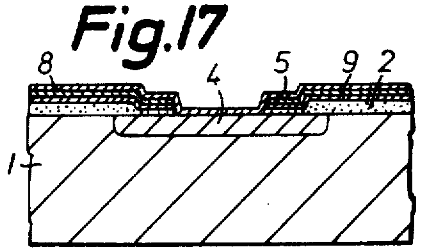

FIG. 14 differs from the arrangement shown in FIG. 13 in that an aperture 7 is introduced into the photosensitive layer 6, and from it the contact-making window 7 is produced by etching through the metal layer 5, the getter or passivating layer 9 and the insulating layer 2', as shown in FIG. 15. In FIG. 16, the photosensitive layer 6, which is generally a lacquer layer, is removed again, whereas in the arrangement shown in FIG. 17, the actual electrode material is applied, namely the metal layer 8, which covers the exposed portion of the semiconductor surface and the metal layer 5.

Figure 18:
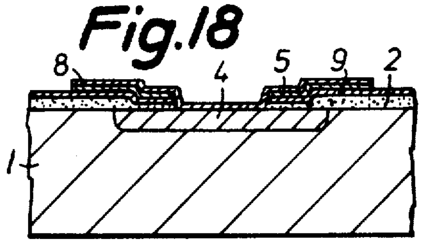

FIG. 18 shows the semiconductor diode with the finished electrode structure which covers the semiconductor surface directly in the area of the contact-making window whereas it rests on the layer sequence, getter and passivating layer as well as insulating layer outside the contact-making area. From this point of view, the part of the metal layer 5 remaining in the finished semiconductor device is regarded as part of the electrode because the parts of the two metal layers situated one above the other outside the actual contact-making region substantially form a unit, which is the case in particular when the same material is used for both metal layers.

Figure 19:
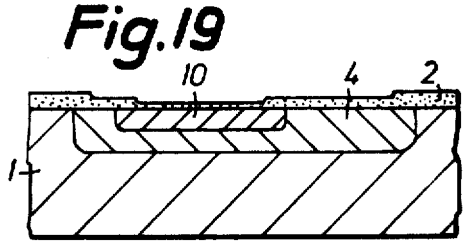
FIGS. 19 to 26 are views similar to FIG. 1 but showing stages in the production of a transistor in accordance with a third embodiment of the method.

The next example relates to the production of a planar transistor according to the invention. FIG. 19 shows a manufacturing stage wherein the base region 4 and the emitter region 10 have already been introduced into a semiconductor body 1 of the type of conductivity of the collector region with an insulating layer 2 present on the surface of the semiconductor. Although the insulating layer 2 which can be seen from FIG. 19 is actually composed of the insulating layer 2 which is already present during the base diffusion, the insulating layer 2′ which is generally formed during the base diffusion, as well as the insulating layer 2′ generally formed during the emitter diffusion, nevertheless only one insulating layer 2 is ever referred to hereinafter.

Figure 20:
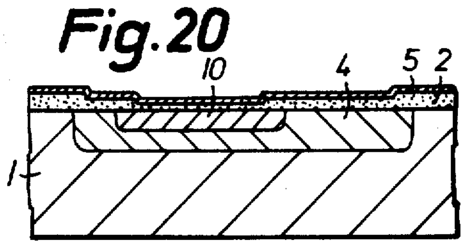
Figure 21:
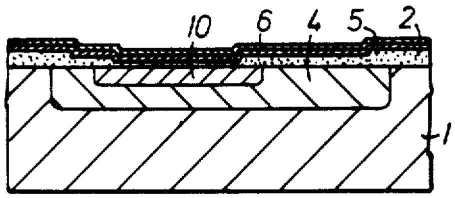
Figure 22:
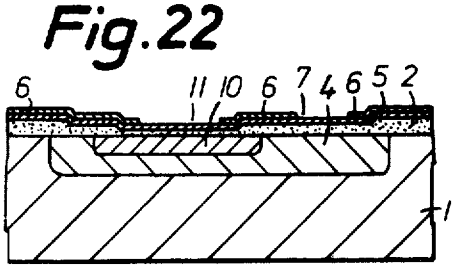
Figure 23:
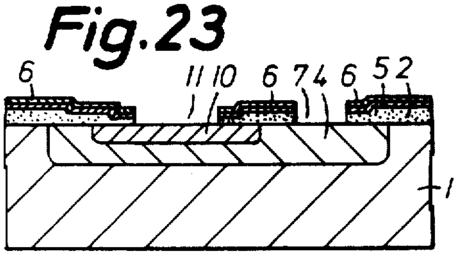
Figure 24:
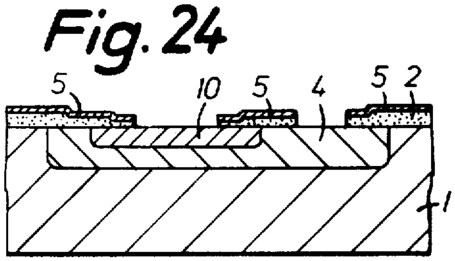

According to the invention, the photosensitive layer necessary for producing the contact-making window is applied not directly to the insulating layer 2 but to a previously applied metal layer which is designated by the reference number 5 in FIG. 20. According to FIG. 21 it is only to this metal layer that the photosensitive layer 6 is applied in which, as shown in FIG. 22, apertures 7 and 11 are introduced which serve as apertures for producing the contact-making windows 7 and 11 in FIG. 23. The photosensitive layer 6 serves as an etching mask during the production of the contact-making windows 7 and 11. The photosensitive layer is removed from the surface again in FIG. 24.

Figure 25:
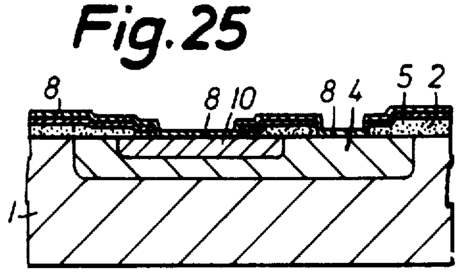
Figure 26:
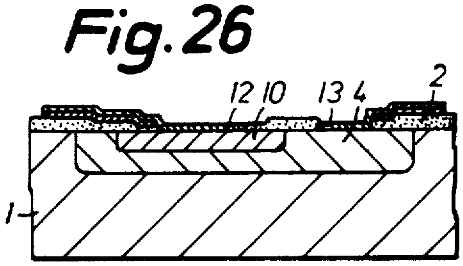
Figure 27:
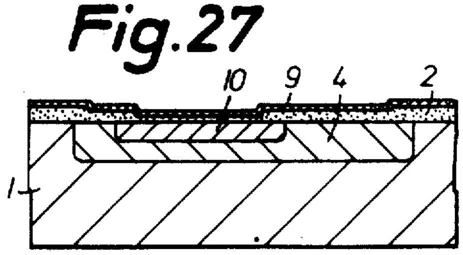
FIGS. 27 to 34 are views similar to FIG. 1 but showing stages in the production of a transistor in accordance with a fourth embodiment of the method.

FIG. 25 shows the device after the vapour-deposition of a metal layer 8 which serves to make contact to the emitter and base regions. Like the metal layer 5, this metal layer 8 likewise consists of aluminium for example. The finished emitter and base electrodes 12 and 13 of FIG. 26, however, are obtained from the metal layer 8 or also from the metal layer 5 by structured etching, likewise by means of a photosensitive layer, although this is not illustrated separately.

Figure 28:
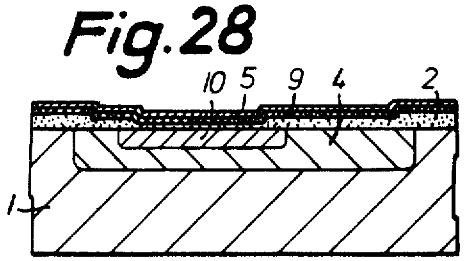
Figure 29:
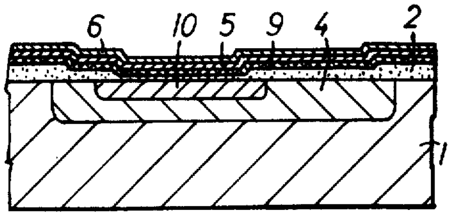
Figure 30:
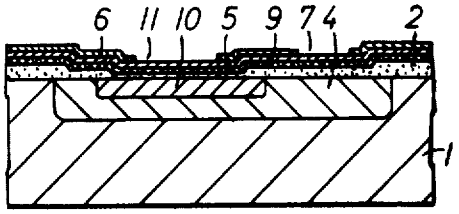
Figure 31:
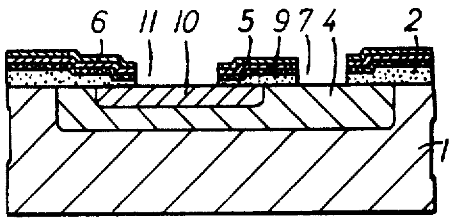
Figure 32:
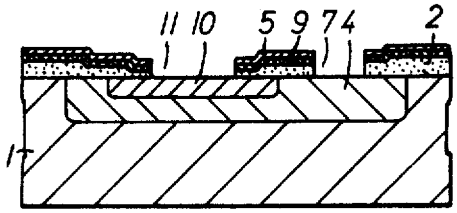
Figure 33:
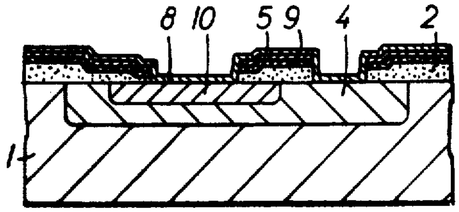
Figure 34:
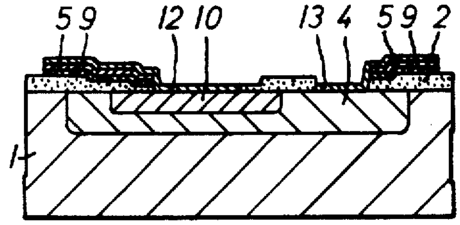

In the example shown in FIGS. 27 to 34, a getter or passivation layer 9 is provided as a further intermediate layer between the insulating layer 2 and the metal layer 5. In this case, the metal layer 5 is not applied to the insulating layer 2 but to the getter or passivating layer 9 as shown in FIG. 28. FIG. 29 shows the photosensitive layer 6 on the metal layer 5, whereas in the arrangement shown in FIG. 30, apertures 7 and 11 have already been introduced into the photosensitive layer 8, so that this layer can serve as an etching mask during the production of the contact-making windows for the emitter and the base region. In the arrangement of FIG. 31, the contact-making windows 7 and 11 are already etched in the layers 5,9 and 2 below the photosensitive layer 6. In FIG. 32, the photosensitive layer 6 is removed again whereas in FIG. 33, the second metal layer 8 is applied which covers both the exposed semiconductor surface and also the metal layer 5. Finally, as shown in FIG. 34, as in the preceding example, the emitter electrode 12 and the base electrode 13 are produced from this metal layer as well as the metal layer 5, by structured etching, the metal layer 5 also being etched in a structured manner, because some of it remains on the getter or passivating layer, namely below the metal layer 8.

It will be understood that the above description of the present invention is susceptible to various modifications, changes and adaptations.

What is claimed is:

1. In a method of producing a semiconductor device comprising the steps of covering one surface of a semiconductor body with an insulating layer, removing part of said insulating layer so as to define an aperture therein, diffusing into said semiconductor body through this aperture a region of opposite type of conductivity to that of said semiconductor body, and closing up said insulating layer over said aperture; the improvement comprising: thereafter applying a metal layer to the entire surface of said insulating layer; applying a photosensitive layer to said metal layer; removing part of said photosensitive layer, said metal layer and said insulating layer by a photolithographic etching technique to form a contact making window for making contact to said diffused region; removing said photosensitive layer while leaving said metal layer on said insulating layer; and covering at least the surface of said semiconductor body exposed by said contact making window with a layer of electrode material.

2. A method as defined in claim 1 wherein said device is a diode.

3. A method as defined in claim 1 wherein said insulating layer is silicon dioxide.

4. A method as defined in claim 1 wherein said step of covering includes covering at least a portion of the surface of said metal layer with said layer of electrode material.

5. A method as defined in claim 4 wherein said layer of electrode material completely covers said metal layer.

6. A method as defined in claim 1 wherein said metal layer and said electrode material are the same material.

7. In a method of producing a transistor comprising the steps of covering one surface of a semiconductor body of the type of conductivity to form a collector region with an insulating layer, removing part of said insulating layer to define a base diffusion window therein, diffusing a base region into said semiconductor body through said base diffusion window, closing up said insulating layer over said base diffusion window, removing part of said insulating layer to define an emitter diffusion window, diffusing an emitter region into said base region through said emitter diffusion window, and closing up said insulating layer over said emitter diffusion window, the improvement comprising: thereafter applying a metal layer to the entire surface of said insulating layer; applying a photosensitive layer to said metal layer; removing part of said photosensitive layer, said metal layer and said insulating layer by a photolithographic etching technique to define contact making windows for said base region and said emitter region; removing said photosensitive layer while leaving said metal layer on said insulating layer; and covering at least the surface of said semiconductor body exposed by said contact-making windows with a layer of electrode material.

8. A method as defined in claim 7, wherein at the time of removing part of said photosensitive layer, said metal layer and said insulating layer to define contact making windows for said base region and said emitter region, a further part of said photosensitive layer, said metal layer and said insulating layer is removed to define a contact making window for said collector region, and the semiconductor surface exposed by said contact making window for said collector region also is covered with said electrode material during said step of covering.

9. A method as defined in claim 7 wherein said step of covering includes covering at least a portion of the surface of said metal layer with said layer of electrode material; and further comprising selectively removing portions of said layer of electrode material and the underlying portions of said metal layer to form spaced electrodes on said surface of said insulating layer for said emitter and base regions.

10. A method as defined in claim 9 wherein said layer of electrode material completely covers said metal layer.

* * * * *

UNITED STATES PATENT OFFICE

CERTIFICATE OF CORRECTION

PATENT NO. : 3,913,214

DATED : October 21, 1975

INVENTOR(S) : Reinhold Kaiser

It is certified that error appears in the above-identified patent and that said Letters Patent are hereby corrected as shown below:

In the heading of the patent, under [73] Assignee: change "Verwaltungs," to --Verwaltungs-GmbH--.

Column 5, line 7, change "2'" to --2''--.

Signed and Sealed this

*second* Day of *March 1976*

[SEAL]

*Attest:*

RUTH C. MASON
*Attesting Officer*

C. MARSHALL DANN
*Commissioner of Patents and Trademarks*